United States Patent [19]
Faulk

[11] Patent Number: 5,677,077
[45] Date of Patent: Oct. 14, 1997

[54] SENSOR CIRCUIT FOR PROVIDING MAXIMUM AND MINIMUM CELL VOLTAGES OF A BATTERY

[75] Inventor: Richard A. Faulk, Cypress, Tex.

[73] Assignee: Compaq Computer Corporation, Houston, Tex.

[21] Appl. No.: 605,727

[22] Filed: Feb. 22, 1996

[51] Int. Cl.$^6$ .................................................. H01M 10/48
[52] U.S. Cl. .................................................. 429/90; 324/433
[58] Field of Search .................................................. 429/90; 324/433

[56] References Cited

U.S. PATENT DOCUMENTS

| | | | |
|---|---|---|---|
| 4,153,867 | 5/1979 | Jungfer | 320/43 |
| 4,316,185 | 2/1982 | Watrous et al. | 324/433 X |
| 4,413,221 | 11/1983 | Benjamin et al. | 320/48 |
| 4,651,081 | 3/1987 | Nishimura et al. | 320/64 |
| 4,724,528 | 2/1988 | Eaton | 364/715 |
| 4,775,827 | 10/1988 | Ijntema et al. | 320/44 |
| 4,803,416 | 2/1989 | Abiven et al. | 320/44 |
| 4,823,086 | 4/1989 | Whitmire et al. | 324/433 X |
| 4,977,393 | 12/1990 | Arnold et al. | 340/636 |
| 5,012,176 | 4/1991 | LaForge | 320/31 |
| 5,204,611 | 4/1993 | Nor et al. | 320/31 |
| 5,218,288 | 6/1993 | Mickal et al. | 320/48 |
| 5,315,228 | 5/1994 | Hess et al. | 320/31 |
| 5,363,312 | 11/1994 | Ninomiya | 364/483 |
| 5,429,889 | 7/1995 | Tu Xuan et al. | 429/90 |
| 5,460,901 | 10/1995 | Syrjälä | 429/90 |
| 5,475,295 | 12/1995 | Hong | 324/433 X |
| 5,514,946 | 5/1996 | Lin et al. | 320/31 |

FOREIGN PATENT DOCUMENTS

| | | |
|---|---|---|
| 225106 | 6/1987 | European Pat. Off. . |
| WO91/08494 | 6/1991 | United Kingdom . |

OTHER PUBLICATIONS

U.S. Patent Appl. S.N. 08/572,963 filed Dec. 15, 1995, Inventor: Freiman et al.
U.S. Patent Appl. S.N. 08/573,029 filed Dec. 15, 1995, Inventor: McConkey et al.
U.S. Patent Appl. S.N. 08/573,296 filed Dec. 15, 1995, Inventor: Mitchell et al.

*Primary Examiner*—Stephen Kalafut
*Attorney, Agent, or Firm*—Pravel, Hewitt, Kimball & Krieger

[57] ABSTRACT

A sensor circuit is provided for monitoring four cells of a battery. The sensor circuit provides a maximum terminal cell voltage and a minimum terminal cell voltage. In a switched capacitor embodiment, one comparator compares the cells, two at a time. The output of the comparator is provided to a maximum state machine and a minimum state machine which select the cells with the highest and lowest voltages, respectively. In a continuous system embodiment, six comparators continuously monitor the cell voltages. The comparator outputs are provided to a maximum logic circuit and a minimum logic circuit which select the cells with the highest and lowest voltages, respectively, and provides a maximum and a minimum terminal voltages signals. These maximum and minimum terminal voltage signals are provided so that a charge controller can monitor the cells for overcharge and discharge conditions.

13 Claims, 11 Drawing Sheets

| E | F | G | H | I | J | MAX. CELL | S1 | S2 | S3 | S4 |
|---|---|---|---|---|---|---|---|---|---|---|
| L | L | H | X | X | X | CELL 104 | L | L | H | L |
| L | X | L | X | X | L | CELL 106 | L | L | L | H |
| L | X | L | X | X | H | CELL 102 | L | H | L | L |
| L | H | H | X | X | X | CELL 102 | L | H | L | L |
| H | X | L | X | L | X | CELL 106 | L | L | L | H |
| H | X | L | X | H | X | CELL 100 | H | L | L | L |
| H | X | H | L | X | X | CELL 104 | L | L | H | L |
| H | X | H | H | X | X | CELL 100 | H | L | L | L |

*FIG. 11*

| E | F | G | H | I | J | MIN. CELL | S5 | S6 | S7 | S8 |
|---|---|---|---|---|---|---|---|---|---|---|
| L | X | L | L | X | X | CELL 100 | H | L | L | L |
| L | X | L | H | X | X | CELL 104 | L | L | H | L |
| L | X | H | X | L | X | CELL 100 | H | L | L | L |
| L | X | H | X | H | X | CELL 106 | L | L | L | H |
| H | L | L | X | X | X | CELL 102 | L | H | L | L |
| H | X | H | X | X | L | CELL 102 | L | H | L | L |
| H | X | H | X | X | H | CELL 106 | L | L | L | H |
| H | H | L | X | X | X | CELL 104 | L | L | H | L |

*FIG. 12*

SENSOR CIRCUIT FOR PROVIDING MAXIMUM AND MINIMUM CELL VOLTAGES OF A BATTERY

BACKGROUND OF THE INVENTION

1. Field of the Invention

The present invention relates to a removable battery pack for supplying power to a computer system and more particularly to a sensor circuit for monitoring battery cells of the battery pack.

2. Description of the Related Art

Computers have often been needed in locations where conventional alternating current power was not available, and rechargeable batteries have typically been used as an alternative source of power, such as nickel-based batteries and lithium ion batteries. These batteries were capable of providing power to a portable or pen-based computer system for several hours. For providing power to the computer system, these batteries have been typically arranged in a battery pack containing series cells in each battery pack. Sometimes, each cell may have included two or more batteries in parallel. The battery pack may have been charged in an external charger or by a power supply of the computer system.

Because of the volatile nature of lithium ion cells, the terminal voltage of each lithium ion cell had to be monitored during charge and discharge. A sensor circuit has typically been used to monitor the voltage of each cell. The terminal cell voltage was indicative of at least four different cell states. One state was when the cell is capable of providing power to the computer system. Another state was when the cell becomes deeply discharged. When a nickel-based or lithium ion cell became deeply discharged, the cell voltage dropped to a deeply discharged minimum voltage which indicated the cell could not be recharged and had to be thrown away. Another state for the cell was indicated by a slightly higher voltage than the deeply discharged minimum voltage, which indicated the cell was discharged but could be recharged. A fourth state for the cell was indicated by the voltage of the cell exceeding a maximum voltage which indicated an overcharged cell.

In what were known as "intelligent" battery packs, the sensor circuit supplied the necessary information to a microprocessor which determined whether the battery pack needed to be charged, could be discharged, or needed to be thrown away. For an intelligent battery pack, the sensor circuit and the microprocessor were located inside the battery pack, and the microprocessor received information from the sensor circuit and enabled or disabled the battery pack accordingly. Such a battery pack system is disclosed in U.S. patent application Ser. No. 08/573,296 entitled "Battery Pack Wakeup" filed Dec. 15, 1996, commonly assigned with the present invention. In a system of this type, the battery pack included a charge switch and a discharge switch controlled by the microprocessor which enabled or disabled the charging and discharging of the battery pack according to the state of the cells.

In so far as is known, the prior art has attempted to prevent unwanted discharging and charging of the cells by using computer circuitry closely connected to the battery to measure the cell voltages. Sensor circuits required intelligent logic and precision analog-to-digital converters to determine battery conditions and charge requirements. The power dissipation and cost of these prior art sensor circuits have however limited their incorporation into battery pack designs.

SUMMARY OF THE PRESENT INVENTION

Briefly, the present invention relates to a sensor circuit for determining cell voltages of a battery pack. In particular, the invention relates to circuitry for providing a minimum terminal cell voltage indicating the lowest voltage determined among the cell voltages and a maximum terminal cell voltage which indicates the highest voltage determined among the cell Voltages. In one switched capacitor embodiment, a comparator circuit is coupled to the battery cells and through a switch network, performs single-ended comparisons of selected cells. The comparator is coupled to an intermediate, a minimum and a maximum state machine. Selection of the cells by the switch network is governed by a switch control circuit. The intermediate state machine provides outputs of an intermediate signal indicative of intermediate comparison result levels sensed by the comparator. This intermediate signal is provided to the maximum and minimum state machines. The maximum state machine provides a maximum cell selector signal which directs a switch network to select the cell with the highest voltage and present the selected cell voltage as a maximum terminal cell voltage signal. The minimum state machine provides a minimum cell selector signal which directs the switch network to select the cell with the lowest terminal cell voltage and present the selected cell voltage as a minimum terminal cell voltage level signal.

In another continuous embodiment, six comparators and four amplifiers are employed to continuously monitor and measure the cell voltages. The outputs of the comparators are connected to a maximum logic circuit which provides a maximum cell selector signal and a minimum logic circuit which provides a minimum cell selector signal. Both the maximum and the minimum cell selector signals are provided to a switch network which select the cells with the highest and lowest voltages, respectively. The voltage levels of these selected cells are furnished as maximum and minimum terminal cell voltage level signals.

The sensor circuits provide a quick response to changes in the cell terminal voltage levels. The switched capacitor embodiment reflects charges within five clock cycles. The continuous embodiment instantaneously updates the maximum and minimum cell terminal voltage levels. Furthermore, no microprocessors, A/D converters or precision voltage references are required. With circuitry that can be fabricated on one simple, low cost integrated circuit, the sensor circuit according to the present invention is capable of inclusion within the battery pack itself.

BRIEF DESCRIPTION OF THE DRAWINGS

A better understanding of the present invention can be obtained when the following detailed description of the preferred embodiment is considered in conjunction with the following drawings, in which:

FIG. 11 is a truth table illustrating operation of the maximum logic circuit of FIG. 10; and FIG. 12 is a truth table illustrating operation of the minimum logic circuit of FIG. 10.

DETAILED DESCRIPTION OF THE PREFERRED EMBODIMENT

1. Overview of the Environment of the Sensor Circuit

Figure 1:
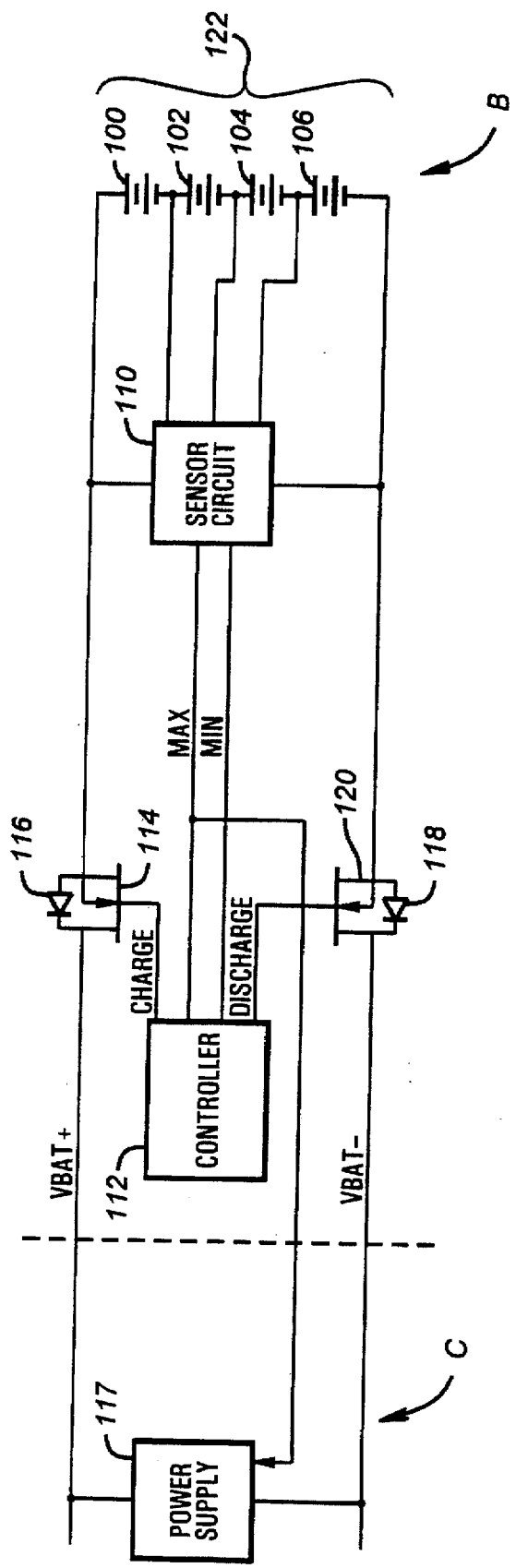
FIG. 1 is a schematic diagram illustrating a battery pack incorporating the present invention.

Shown in FIG. 1 is a battery pack B having a VBAT+ terminal and a VBAT− terminal for providing and receiving power to and from a host computer system C. VBAT+ and VBAT− are voltage levels provided by the positive and negative terminals of a battery 122 when conventional alternating current power is unavailable. When alternating current is available, a power supply 117 of the computer system C furnishes power to the battery 122. The power supply 117 fast charges the battery 122 until a received maximum voltage level signal MAX indicates a cell of the battery 122 has reached its full charge. After this, the battery 122 is trickle-charged by the power supply 117.

The battery 122 has four series cells: cell 100, cell 102, cell 104 and cell 106. Each cell includes two parallel batteries. When conventional alternating current power is unavailable, battery 122 provides power to the host computer system when battery 122 is capable of discharging.

Battery pack B includes a sensor circuit 110 which is coupled to battery cells 100, 102, 104 and 106. Sensor circuit 110 provides the maximum cell terminal voltage level signal, MAX, and a minimum cell terminal voltage level signal, MIN. MAX and MIN represent the maximum and minimum terminal cell voltages, respectively, of battery 122. Both of the signals MAX and MIN are provided to a controller 112 which controls a charge transistor 114 and a discharge transistor 120. Both transistors 120 and 114 are N-channel, metal-oxide-semiconductor field-effect-transistors (MOSFETs).

In the described embodiment, the maximum cell terminal voltage level MAX is furnished as an analog signal to the power supply 117. However, in order to avoid noise problems, another embodiment might include an error comparator (not shown) in the battery pack B which compares the voltage level of MAX with a predetermined voltage level. A digital error signal is then furnished by the error comparator to the power supply 117. Thus, in this embodiment, the power supply 107 receives a digital signal, free from noise, which indicates when one of the cells of the battery 122 has exceeded the predetermined voltage level.

Figure 2:
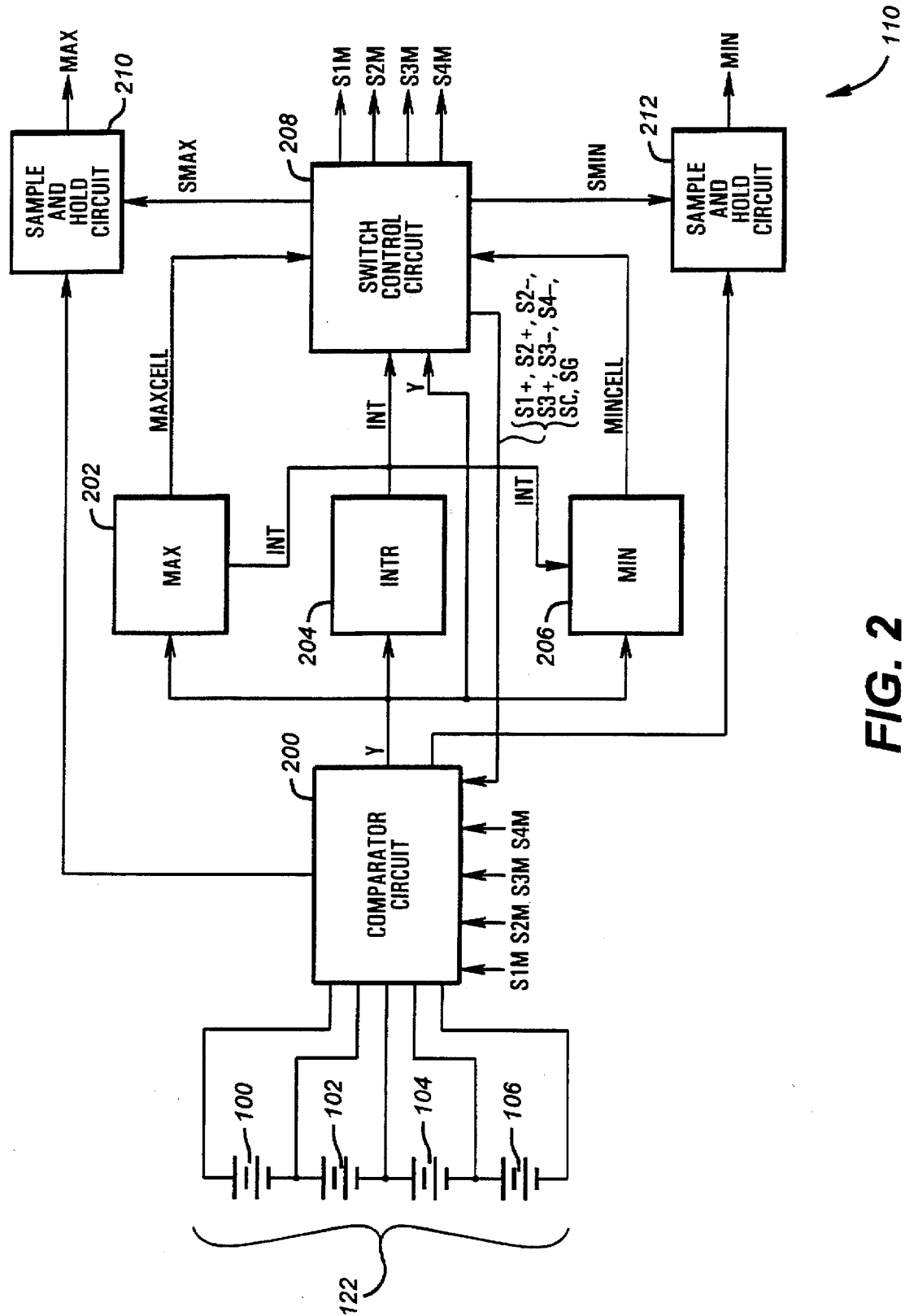
FIG. 2 is a block diagram of one embodiment of the sensor circuit of FIG. 1.
Figure 3:
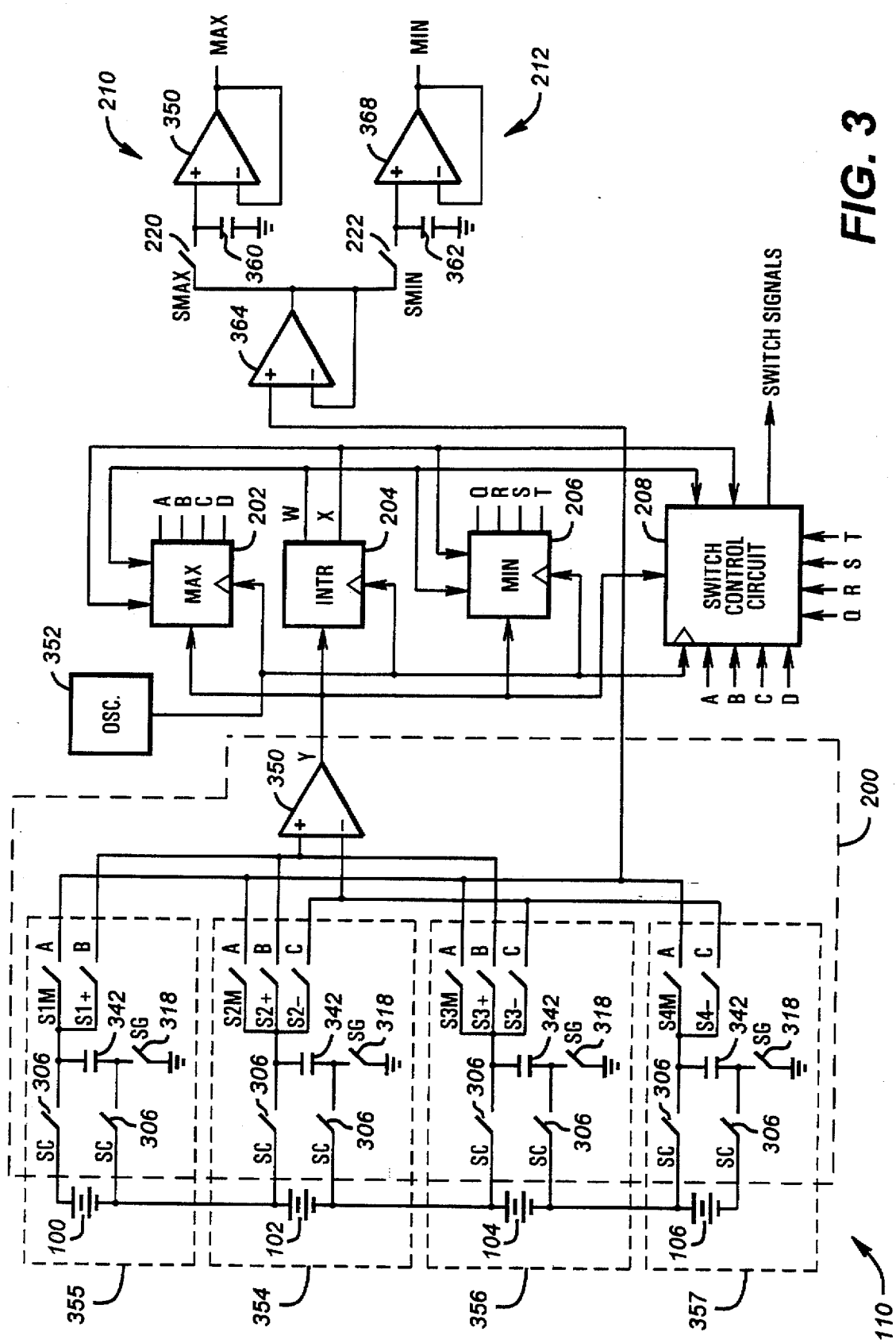
FIG. 3 is a more detailed schematic diagram of the comparator and sample and hold circuits of FIG. 2.
Figure 10:
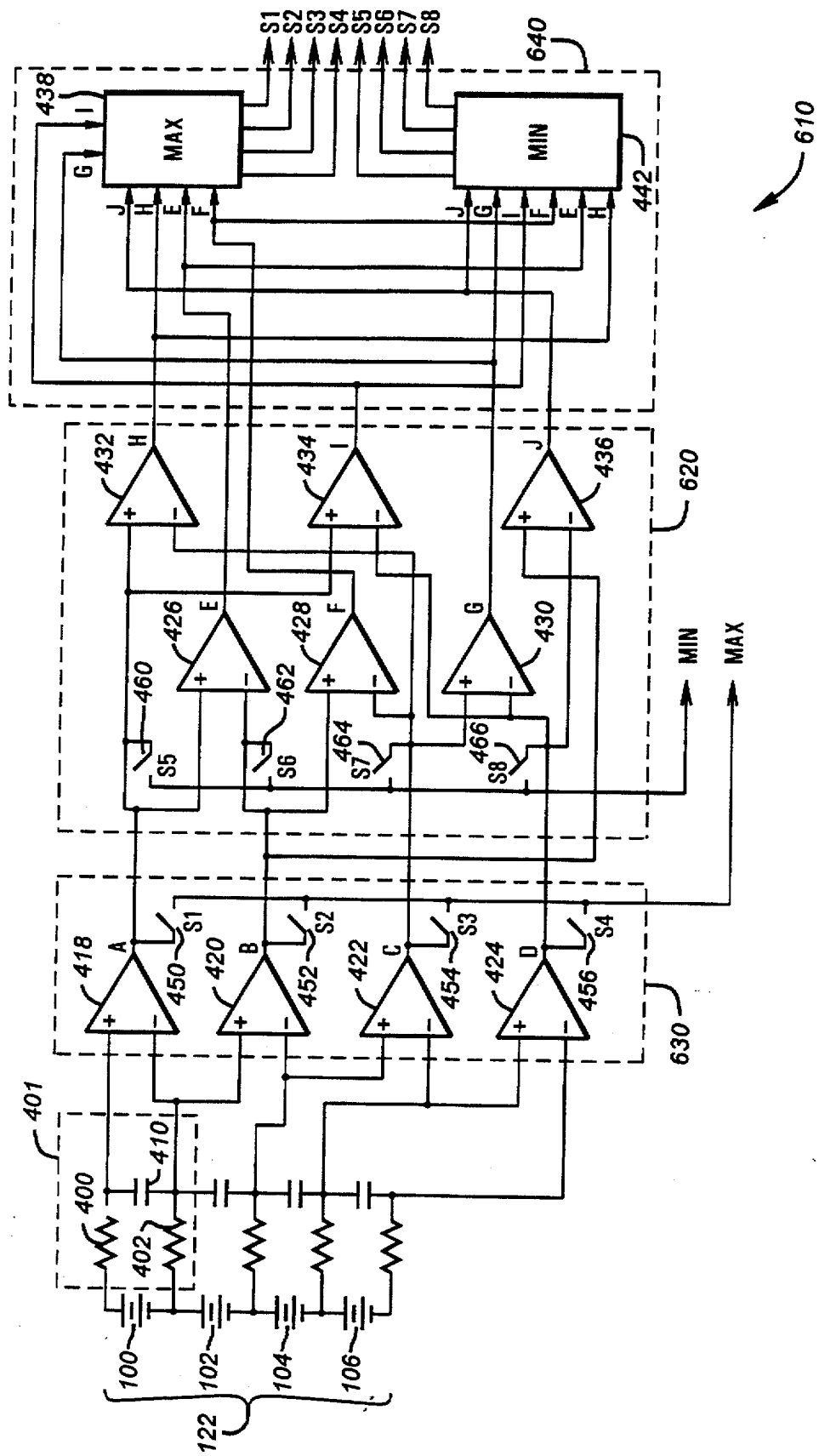
FIG. 10 is an alternative embodiment of the sensor circuit of FIG. 1.

The sensor circuit 110 of FIG. 1 has two alternative forms according to the present invention: a switched capacitor embodiment shown as a circuit 111 in FIGS. 2 and 3; and a continuous embodiment 610 which is shown in FIG. 10. Each of these embodiments described below is suitable for a one embodiment of the sensor circuit 110.

Transistor 114 has its source connected to the positive terminal of cell 100, and the drain of transistor 114 is connected to the VBAT+ terminal. The gate of transistor 114 is connected to controller 112 over a control line labeled CHARGE. The source of transistor 120 is connected to the negative terminal of cell 106, and the drain of transistor 120 is connected to the VBAT− terminal. The gate of transistor 120 is connected to controller 112 over a control line labeled DISCHARGE.

A diode 116 and a diode 118 provide a discharge path and a charge path, respectively, when a signal is asserted over the respective CHARGE or DISCHARGE line. Diode 116 has its anode coupled to the positive terminal of cell 100, and the cathode of diode 116 is connected to VBAT+. The anode of diode 118 is connected to the negative terminal of cell 106, and the cathode of diode 118 is connected to the VBAT− terminal. Thus, when controller 112 asserts a signal on control line CHARGE, transistor 114 conducts and battery 122 accepts charge through the current path provided by transistor 114 and diode 118. Conversely, when a signal on control line DISCHARGE is asserted, battery 122 discharges through the current path provided by transistor 120 and diode 116.

2. The Switched Capacitor Embodiment a. Overview

A switched capacitor embodiment 111 (FIGS. 2 and 3) of the sensor circuit 110 in FIG. 1 includes a comparator circuit 200 which is coupled to battery cells 100, 102, 104 and 106 as shown. Comparator circuit 200 includes a single comparator 350 (FIG. 3) which compares the terminal voltage levels of selected pairs of battery cells of battery 122 as they are connected to comparator circuit 200 by a switch control circuit 208. Comparator circuit 200 provides the result of the two cell comparison through an output compare signal, Y, for further analysis, as will be discussed.

Figure 4:
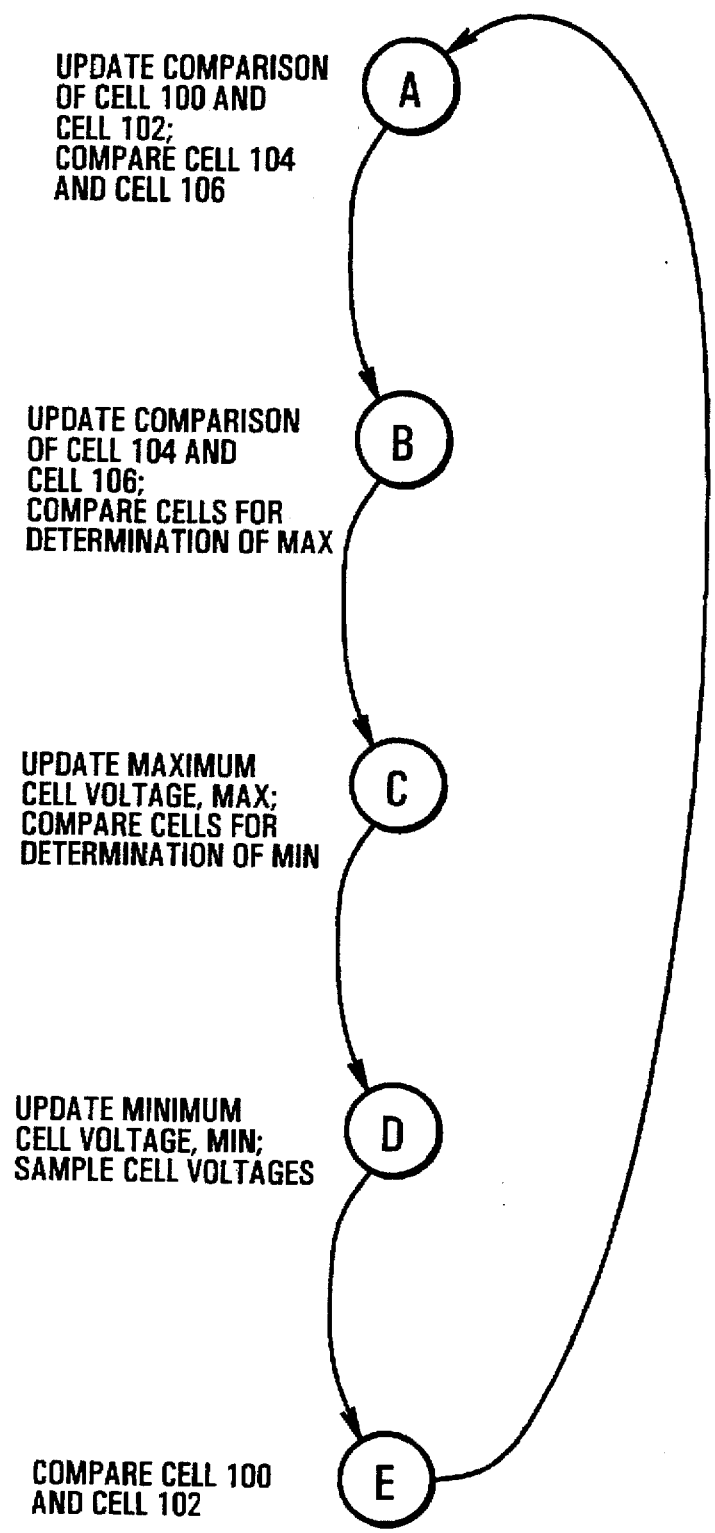
FIG. 4 is a state diagram illustrating the states of the sensor circuit.

A state diagram (FIG. 4) illustrates the five states of sensor circuit 111 according to the present invention. These states are possible based on the comparison results of the voltage levels in the battery cells by comparator circuit 200. The comparison of cells by comparator circuit 200 is directed by switching signals provided by switch control circuit 208.

In state A of sensor circuit 111 (FIG. 4), sensor circuit 111 updates the comparison of cell 100 and cell 102, as explained further below. Additionally, during state A of sensor circuit 111, sensor circuit 111 compares the terminal voltage levels of cells 104 and 106. An intermediate state machine 204 receives the output compare signal Y from comparator circuit 200 and provides a multi-bit intermediate comparison signal, INT. INT contains the result from the comparison of different cells. Each bit of INT represents the result of the comparison of the terminal voltage levels of two cells. In the described embodiment, INT is a two bit signal represented by two separate one bit signals, X and W. W is a logic signal indicating the result of the comparison of the terminal voltage levels of cells 100 and 102, and X is a logic signal indicating the result of the comparison of the terminal voltage levels of cells 104 and 106.

Figure 6:
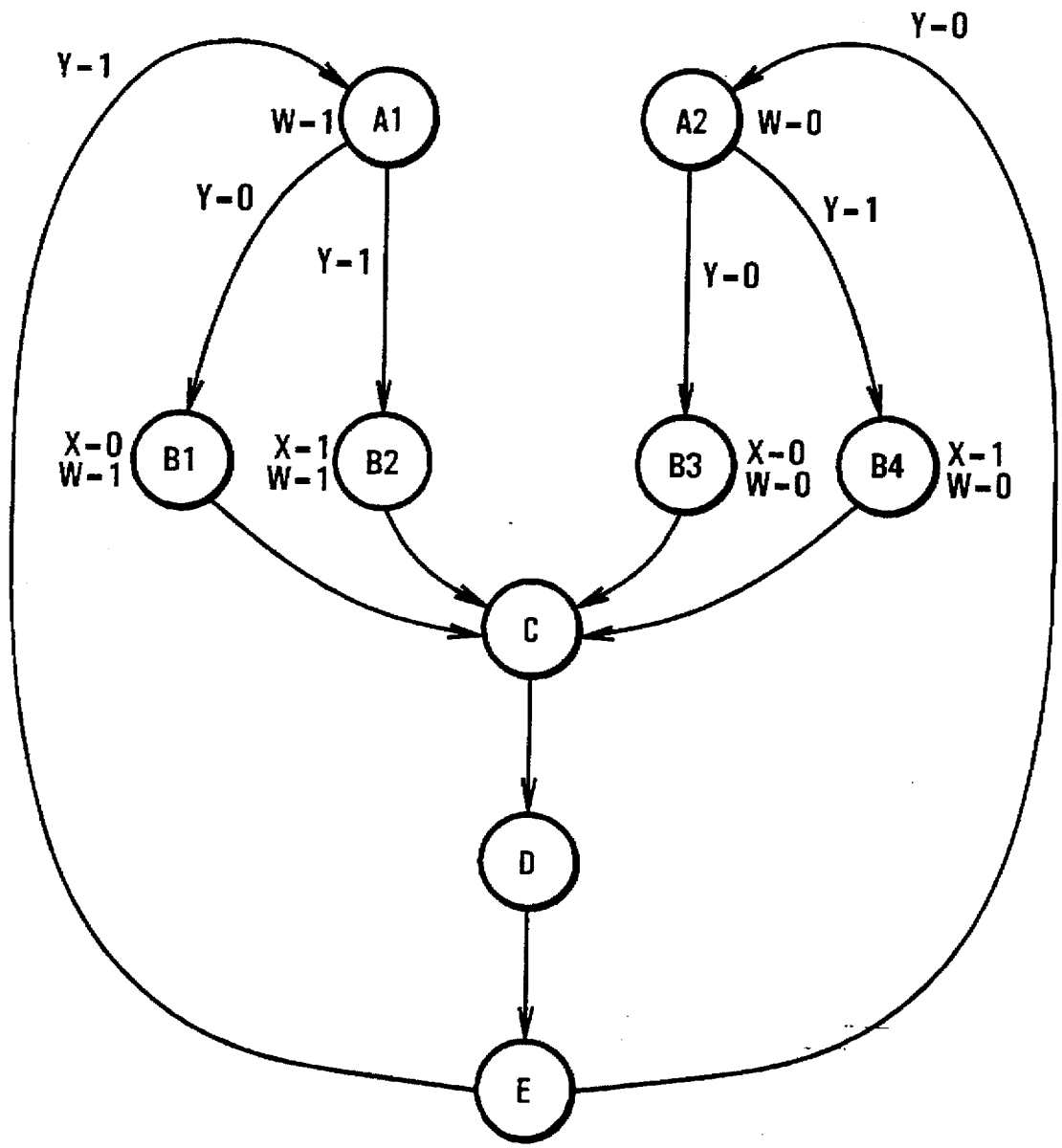
FIG. 6 is a state diagram illustrating operation of the intermediate state machine of FIG. 3.

Intermediate state machine 204 has two possible states when sensor circuit 111 is in state A, states A1 and A2 (FIG. 6), and four possible states when sensor circuit 111 is in state B: states B1, B2, B3 and B4. States C, D and E of intermediate state machine 204 correspond to states C, D and E, respectively, of sensor circuit 111.

A high W, present in state A1 of intermediate state machine 204, indicates that the terminal voltage level of cell 100 is greater than the terminal voltage level of cell 102. A high X, present in states B2 and B4 of intermediate state machine 204, indicates that the terminal voltage level of cell 104 is greater than the terminal voltage level of cell 106. Conversely, the negation of W, present in state A2 of intermediate state machine 204, indicates that the terminal voltage level of cell 102 is greater than the terminal voltage level of cell 100. Furthermore, the negation of X, present in states B1 and B3 of intermediate state machine 204, indicates that the terminal voltage level of cell 106 is greater than the terminal voltage level of cell 104. In state A of sensor circuit 111, intermediate state machine 204 updates X with the result of the comparison of the terminal voltage levels of cells 104 and 106.

During state B of sensor circuit 111, the result of the comparison of the terminal voltage levels of cells 104 and 106 is updated by intermediate state machine 204 in states B1, B2, B3 and B4 of intermediate state machine 204. Additionally, during state B of sensor circuit 111, switch control circuit 208 directs comparator circuit 200 to compare two additional selected cells, the selection of which is discussed in more detail below.

Figure 9:
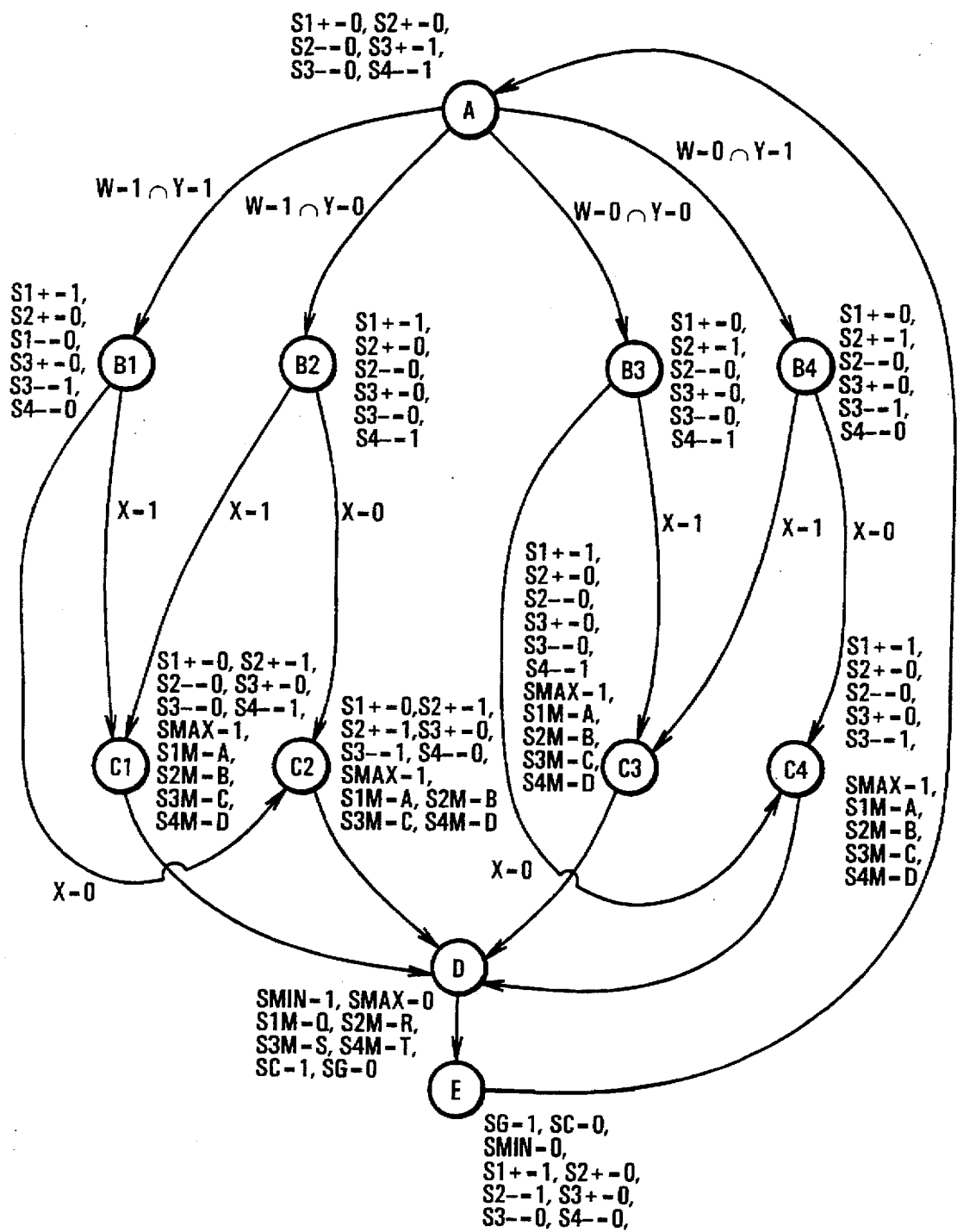
FIG. 9 is a state diagram illustrating operation of the switch control circuit of FIG. 3.

During state B of sensor circuit 111, switch control circuit 208 has four possible states: B1, B2, B3 and B4 (FIG. 9). Switch control circuit 208 has four possible states when sensor circuit is in state C: states C1, C2, C3 and C4. States A, D and E of switch control circuit 208 correspond to states A, D and E, respectively of sensor circuit 111.

Figure 7:
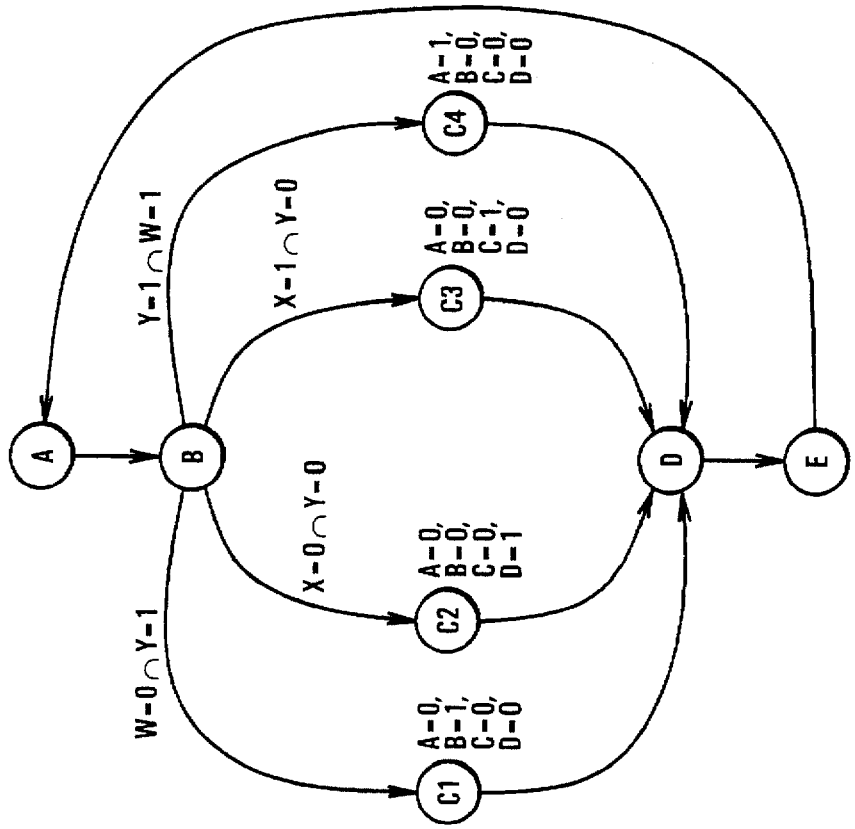
FIG. 7 is a state diagram illustrating operation of the maximum state machine of FIG. 3.

Sensor circuit 111 then moves to state C of sensor circuit 111 in which a maximum cell indicator circuit, maximum state machine 202, updates a multi-bit maximum cell selector signal, MAXCELL during states C1, C2, C3 and C4 of maximum state machine 202 (FIG. 7). States A, B, D and E of maximum state machine 202 correspond to states A, B, D and E, respectively of sensor circuit 111.

Only one bit is asserted in MAXCELL at any one time and the asserted bit in MAXCELL indicates the cell of battery 102 with the highest terminal voltage level. In the described embodiment, MAXCELL is a four bit signal represented by four separate bit signals, A, B, C and D. MAXCELL is provided to switch control circuit 208.

During state C, switch control circuit 208 receives MAXCELL from maximum state machine 202 and closes the appropriate switches to update the maximum cell terminal voltage level MAX. Maximum state machine 202 has as its inputs X, W and Y. Thus, the comparison of cells 100 and 102; cells 104 and 106; and the comparison of the two cells compared in state B of sensor circuit 111 furnishes maximum state machine 202 with the information necessary to generate MAXCELL.

MAXCELL is an input to switch control circuit 208 which provides switch signals S1M, S2M, S3M and S4M to comparator circuit 200 during states C1, C2, C3 and C4 of switch control circuit 208. These switch signals direct comparator circuit 200 to select the cell with the highest terminal voltage level and provide this voltage level to a sample and hold circuit 210 during state C of sensor circuit 111. The assertion of S1M selects cell 100; the assertion of S2M selects cell 102; the assertion of S3M selects cell 104; and the assertion of S4M selects cell 106. Sample and hold circuit 210 provides the maximum cell terminal voltage level MAX.

During state C of sensor circuit 111, a sample enable signal, SMAX, is asserted by switch control circuit 208 in states C1, C2, C3 and C4 of switch control circuit 208 which allows sample and hold circuit 210 to update MAX by sampling the voltage provided by comparator circuit 200. Switch control circuit 208 negates SMAX during its other states. The negation of SMAX places sample and hold circuit 210 in a hold mode in which sample and hold circuit 210 does not update MAX. Also during state C of sensor circuit 111, switch control circuit 208 directs comparator 200 to compare the terminal voltage levels of two cells in order that the minimum cell voltage MIN can be updated in state D of sensor circuit 111, as discussed further below.

During state D, switch control circuit 208 closes the appropriate switches in order to update MIN. A minimum state machine 206 receives X, W and Y. Thus, the comparison of cells 100 and 102; cells 104 and 106; and the two cells compared in state C of sensor circuit 111, the result of which is provided by Y, furnishes minimum state machine 206 with information necessary to provide a multi-bit minimum cell selector signal, MINCELL.

Figure 8:
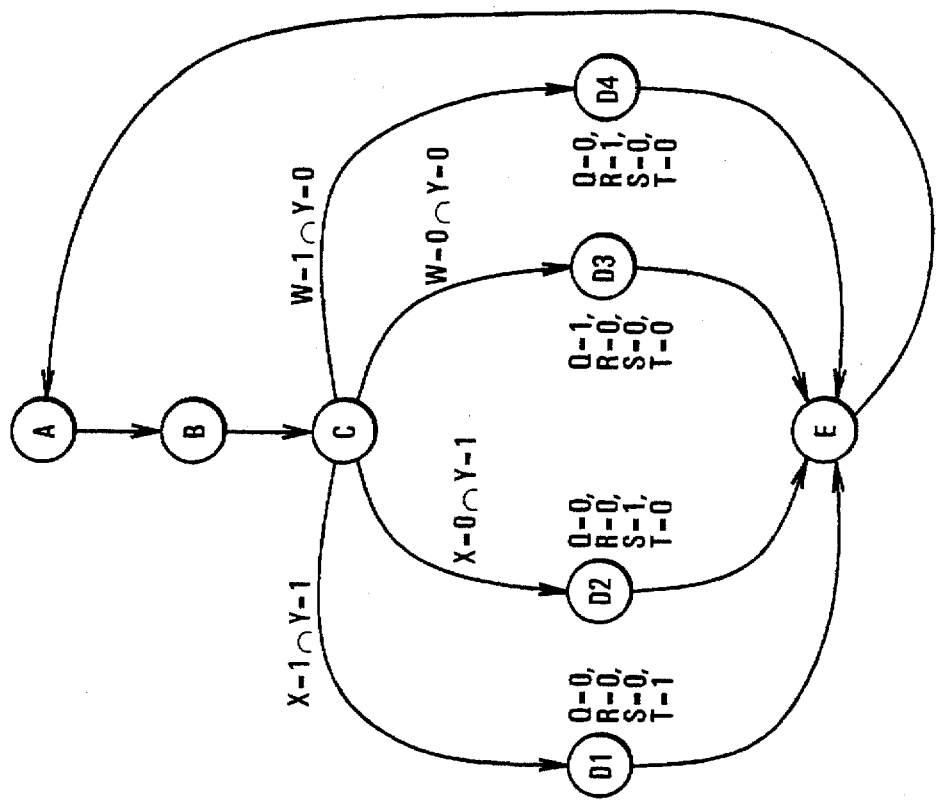
FIG. 8 is a state diagram illustrating operation of the minimum state machine of FIG. 3.

Minimum state machine 206 updates MINCELL during either states D1, D2, D3 and D4 of minimum state machine 206 which corresponds to state D of sensor circuit 111 (FIG. 8). States A, B, C and E of minimum state machine 206 correspond, respectively, to states A, B, C and E of sensor circuit 111.

Only one bit is asserted in MINCELL at any one time, and the asserted bit in MINCELL indicates the cell of battery 102 with the lowest terminal voltage level. In the described embodiment, MINCELL is a four bit signal represented by four separate bit signals: Q, R, S and T. Switch control circuit 208 receives MINCELL and from this information, switch control circuit 208 provides appropriate switch signals to comparator circuit 200.

Comparator circuit 200, from these received switch signals, selects the cell having the lowest terminal voltage level and provides this voltage level to a sample and hold circuit 212 during state D of sensor circuit 111. Furthermore, during state D of switch control circuit 208 and sensor circuit 111, switch control circuit 208 asserts SMIN which enables sample and hold circuit 212 to sample the cell terminal voltage level provided by comparator circuit 200 in order to update its output voltage MIN. When not in state D, switch control circuit 208 negates SMIN which places sample and hold circuit 212 in a hold mode in which sample and hold circuit 212 does not update MIN.

The progression of sensor circuit 111 through the various states in conjunction with comparator circuit 200 is sequenced by a clock signal from an oscillator 352 (FIG. 3) whose output is coupled to state machines 202, 204, 206 and 208.

Battery cells 100, 102, 104 and 106 are connected to switch circuits 355, 354, 356 and 357, respectively. Each of these switch circuits are of like construction, and switch circuit 354 is described below.

The terminal voltage level of cell 102 is provided to a capacitor 342 through switches 306 which are activated by a signal SC. Capacitor 342 is coupled to ground through a switch 318 activated by a signal SG. SG and SC are complementary signals provided by switch control circuit 208.

Before the sequence of comparisons made by comparator 350, switches 306 are closed and switch 318 is opened. This allows capacitor 342 to store the charge indicative of the most recently sampled cell terminal voltage level. The switches 306 are then opened, and the switch 318 is closed, which furnishes a single-ended reference of the sampled cell voltage.

Switch circuit 354 includes a switch A which selectively couples the terminal voltage level of cell 102 provided by capacitor 342 to the non-inverting input of a voltage buffer 364. When this occurs, cell 102 has either the lowest or the highest terminal cell voltage level. A switch B of switch circuit 354 selectively couples the terminal voltage level of cell 102 to the non-inverting input of comparator 350. A switch C of switch circuit 354 selectively couples the terminal voltage level of cell 102 to the inverting input of comparator 350.

Similar notation applies to the other switch circuits. For example switch B of switch circuit 355 selectively couples the terminal voltage level of cell 100 to the non-inverting input of comparator 350, and switch C of switch circuit 357 selectively couples the terminal voltage level of cell 357 to the inverting input of comparator 350.

For the following discussion, switch A of switch circuit 355 will be referred to as switch 355A, switch B of switch circuit 356 will be referred to as switch 356B, etc. Switches 355A, 354A, 356A and 357A are activated by switch signals S1M, S2M, S3M and S4M, respectively. Switches 355B, 354B and 356B are activated by switch signals S1M, S2M, and S3M, respectively. Switches 354C, 356C and 357C are activated by S2−, S3− and S4−, respectively.

Still referring to switch circuit 354, in state D of switch control circuit 208, switch control circuit 208 asserts SC and negates SG which, closes switches 306 and opens switches 318. Thus, in state D of switch control circuit 208, cell 102 charges capacitor 342 until the terminal voltage of capacitor 342 is at the level of the terminal voltage level of cell 102. During the other states of switch control circuit 208, switch control circuit 208 negates SC and asserts SG which opens switches 306 and closes switch 318. During these other states, the voltage level indicated by the charge on capacitor 342 is selectively provided to either an input of comparator 350 or to the non-inverting input of the amplifier 364.

Unity-gain amplifier 364 provides a buffered terminal cell voltage to sample and hold circuit 210 during state C of sensor circuit 111 and to sample and hold circuit 212 during state D of sensor circuit 111. The terminal cell voltage provided by amplifier 364 depends on the switch closed by switch control circuit 208.

Amplifier 364 receives the maximum terminal cell voltage MAX in state C of sensor circuit 111 or the minimum cell voltage MIN in state D of sensor circuit 111. Amplifier 364 by having its inverting input connected to its output and functioning as an inverting buffer provides these signals to either the inputs of a amplifier 366 or an amplifier 368, depending on the switch closed by switch control circuit 208.

When, in state C of sensor circuit 111, switch control circuit 208 asserts SMAX which closes a switch 220 and provides MAX to a capacitor 360 coupled between the non-inverting input of amplifier 366 and ground. When sensor circuit 111 is not in state C, switch control circuit 208 opens switch 220. Capacitor 360 then holds the voltage level of MAX until MAX is once again updated when sensor circuit 111 is once again in state C.

Conversely, when SMIN is asserted which closes a switch 222, the output of amplifier 364 provides MIN to a capacitor 362 coupled between the non-inverting input of amplifier 368 and ground. When sensor circuit 111 is not in state C, switch control circuit 208 opens switch 222 and the terminal voltage of capacitor 362 is equal to MIN. Capacitor 362 then holds the voltage level of MIN until sensor circuit 111 is again in state D.

b. The Sequencing of Signals

Figure 5A:
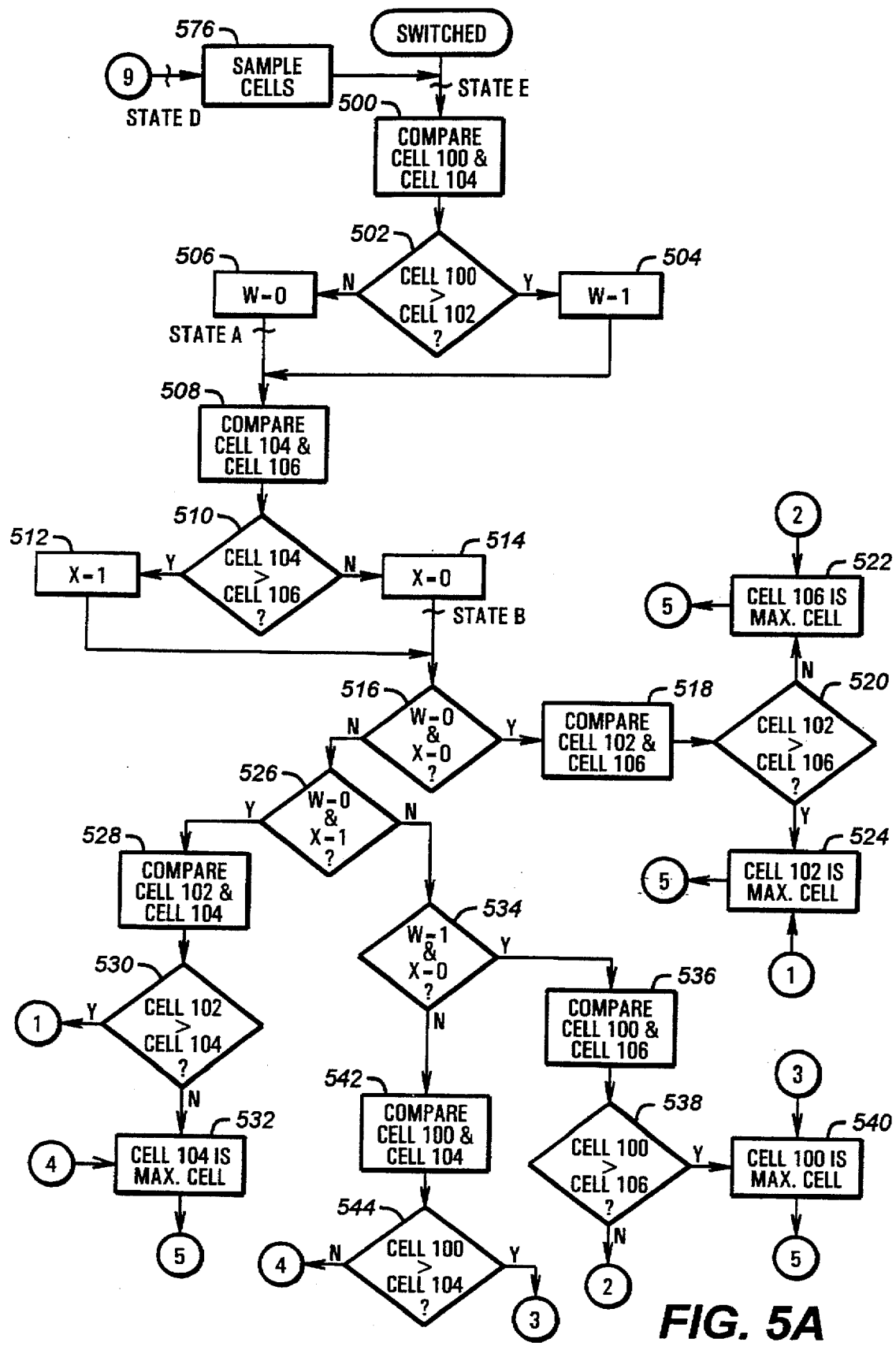
FIGS. 5A and 5B is a flowchart diagram illustrating the logic of the sensor circuit.
Figure 5B:
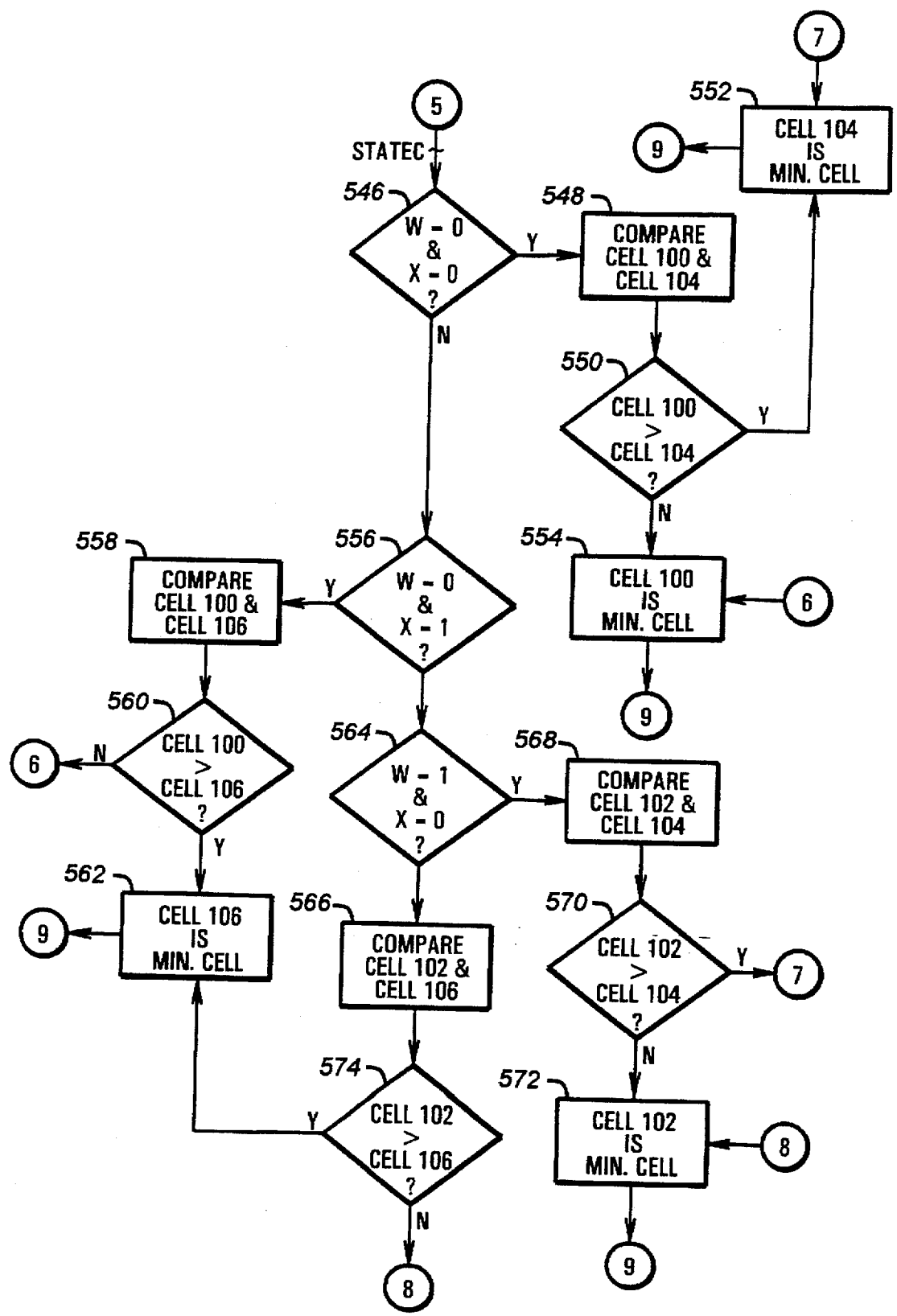

FIGS. 5A and 5B illustrate the sequencing of signals by switch control circuit 208. Logic "one" or "high" is represented by a "1," and logic "zero" or "low" is represented by a "0." At step 500, switch control circuit 208 is at state C and sensor circuit 111 is at state E. Switch control circuit 208 closes switch 355B and closes switch 354C, by asserting S1+ and S2−, in order to provide the terminal voltage levels of cells 100 and 102 to comparator 350 for comparison.

Control then passes to step 502 where comparator 350 provides the result of this comparison through its output Y.

If in step 502, the terminal voltage level of cell 100 is greater than the terminal voltage level of cell 102, as indicated by Y, then in step 504 intermediate state machine 204 asserts W in state A1 of intermediate state machine 204. If in step 502, the terminal voltage level of cell 100 is less than the terminal voltage level of cell 102, then intermediate state machine 204 negates W in state A2 of intermediate state machine 204.

Control passes from both steps 504 and 506 to step 508 as sensor circuit 111 transitions to state A and intermediate state machine 204 updates W in either state A1 or A2 of intermediate state machine 204. This is done to indicate the result of the cell comparison made in state E of sensor circuit 111. In step 508, switch control circuit 208 closes switches 356B and 357C, by asserting S3+ and S4−, in order to compare the terminal cell voltage levels of cells 104 and 106. Control then passes to step 510, where comparator 350 provides the result of this comparison.

If during step 510 the terminal voltage level of cell 104 is greater than the terminal voltage level of cell 106, then control transfers to step 512. During step 512, intermediate state machine 208 asserts X in either state B2 or B4 of intermediate state machine 204, depending on whether W is asserted or negated, respectively.

If during step 510 the terminal voltage level of cell 104 is less than the terminal voltage level of cell 106, then control passes to step 514. During step 514, intermediate state machine 204 negates X in either state B1 or B3 of intermediate state machine 204, depending on whether W is asserted or negated, respectively.

Control passes from both steps 512 and 514 to step 516 as sensor circuit 111 transitions to state B. In state B, intermediate state machine 204 updates X in state B1, B2, B3 or B4 of intermediate state machine 204. This is done to indicate the result of the cell comparison made in state A1 or A2 of intermediate state machine 204. Switch control circuit 208 transitions from state A to either state B1, B2, B3 or B4 of switch control circuit 208 based on the result of the comparisons of the terminal cell voltage levels of cells 100 and 100 and cells 104 and 106. Switch control circuit 208 then selects two additional cells to be compared. The result of this comparison provides the information necessary for maximum state machine 202 to update MAXCELL. The cells selected for comparison by switch control circuit 208 are determined from Y and W.

In step 516 if W is low and X is low, then switch control circuit 208 is in state B3 and control passes to step 518 in which switch control circuit 208 closes switches 354B and 357C, by asserting S2+ and S4−, to compare the terminal voltage levels of cells 102 and 106. Control passes from step 518 to step 520 where comparator 350 provides the result of this comparison.

If during step 520 the terminal voltage level of cell 102 is greater than the terminal voltage level of cell 106 then control passes to step 524. During step 524 comparator 350 asserts Y which indicates that cell 102 has the maximum terminal cell voltage level. Control then passes from step 524 to step 546, where sensor circuit 111 transitions from state B to state C. During step 546 maximum state machine 202 also transitions from state B to state C1 of maximum state machine 202 (see FIG. 7). In state C1, maximum state machine 202 asserts bit B of MAXCELL which indicates that cell 102 has the maximum cell voltage. The assertion of bit B informs switch control circuit 208 to close switch 354A during state C of sensor circuit 111 in order that MAX will be updated with the terminal voltage of cell 102.

If in comparison step 520 the terminal voltage level of cell 102 is lees than the terminal voltage level of cell 106, then control transfers to step 522. During step 522, comparator 350 negates Y to indicate cell 106 has the maximum terminal voltage level. Control then transfers from step 522 to step 546 in which sensor circuit 111 transitions to state C and maximum state machine 202 transitions to state C2. In state C2, maximum state machine 202 indicates, by asserting D of MAXCELL, that cell 106 has the maximum terminal cell voltage level. The assertion of bit D also informs switch control circuit 208 to close switch 357A during state C of sensor circuit 111. This is done in order that MAX will be updated with the terminal voltage of cell 106.

If in state B, W is high or X is high, then control transfers from step 516 to step 526, where switch control circuit 208 determines whether W is low and X is high. If so, then control transfers to step 528 where switch control circuit 208 is in state B4. In state B4, switch control circuit 208 closes switches 354B and 356C, by asserting S2+ and S3−, and comparator 350 compares the terminal voltage levels of cells 102 and 104. Control then transfers to step 530. If, during comparison step 530, the terminal voltage level of cell 102 is sensed as greater than the terminal voltage level of cell 104, then control transfers from step 530 to step 524.

If, however, the terminal voltage level of cell 102 is sensed as less than the terminal voltage level of cell 104, control transfers from step 530 to step 532. During step 532 maximum state machine 202 asserts bit C of MAXCELL during state C3 of maximum state machine 202. This is done to indicate that cell 104 has the maximum terminal cell voltage level. Switch control circuit then closes switch 356A in state C of sensor circuit 111 to update MAX with the terminal voltage level of cell 104. Control transfers from step 532 to step 546.

If in step 526, W is high or X is low, then control transfers from step 526 to step 534, where switch control circuit 208 determines whether W is high and X is low. If so, then control transfers from step 534 to step 536 where switch control circuit 208, in state B2, closes switches 355A and 357C. This is done by asserting S1+ and S4−, in order to compare the terminal voltage levels of cells 100 and 106. Control transfers from step 536 to step 538 where comparator 350 indicates the result of the comparison through its output signal Y.

If during step 538 the terminal voltage level of cell 100 is less than the terminal voltage level of cell 106, control transfers to step 522. If the terminal voltage level of cell 100 is greater during step 538 than the terminal voltage level of cell 106, control transfers to step 540. In step 540 maximum state machine 202, in state C4 of maximum state machine 204, asserts bit A in MAXCELL to indicate cell 100 has the maximum terminal voltage level. Control transfers from step 540 to step 546.

If in step 534, W is low or X is high, then control transfers from step 534 to step 542 rather than step 536. During step 536 switch control circuit 208, in state B1 of switch control circuit 208, closes switches 355B and 356C, by the assertion of S1+ and S3−. This is done in order to compare the terminal voltage levels of cells 100 and 104. Control then transfers from step 542 to step 544, where comparator 350 provides the result of this comparison in its output signal Y.

If the terminal voltage level of cell 100 is greater than the terminal voltage level of cell 104, then control transfers from step 544 to step 540, during which cell 100 is indicated as having maximum voltage, as described. If the terminal voltage level of cell 100 is less than the terminal voltage level of cell 104, then control transfers from step 544 to step 532 where operations proceed in the manner described above.

As set forth above, step 546 ensues after step 540. At step 546, sensor circuit 111 transitions to state C. In state C, MAX is updated by maximum state machine 202. Thus, switch control circuit 208 asserts SMAX which closes switch 220, and switch control circuit 208 then selects the appropriate cell as directed by MAXCELL by closing either switch 355A, 354A, 356A or 357A, as discussed above.

In state C, sensor circuit 111 compares the terminal voltage level of two cells in order to determine the minimum terminal voltage level which is used to update MIN during state D of sensor circuit 111. In step 546, switch control circuit 208 determines whether W is low and X is low. If so, then switch control circuit 208, in state C4 of switch control circuit 208, selects cells 100 and 104 for comparison by closing switches 355B and 356C by asserting S1+ and S3−. Control passes from step 548 to step 550 where comparator 350 provides the result of this comparison.

If, during step 550 the terminal voltage level of cell 100 is greater than the terminal voltage level of cell 104, control transfers to step 552. In step 552 minimum state machine 206 in state D2 of minimum state machine 206, asserts bit S of MINCELL. Switch control circuit 208 asserts SMIN and closes switch 356A in state D to update MIN with the terminal voltage level of cell 104.

If in step 550, comparator 350, however, indicates that the terminal voltage level of cell 100 is less than the terminal voltage level of cell 104, control transfers from step 550 to step 554. In step 554 minimum state machine 206, in state D3, asserts bit Q of MINCELL.

If in step 546 W is high or X is high, then control transfers to step 556. In step 556 switch control circuit 208 determines whether W is low and X is high. If so, then during step 558 switch control circuit 208, in state C3 of switch control circuit 208, closes switches 355B and 357C, by asserting Si+ and S4−. This is done in order for comparator 350 to compare the terminal voltage levels of cells 100 and 106. Control transfers from step 558 to step 560, where comparator 350 indicates whether the terminal voltage level of cell 100 is greater than the terminal voltage level of cell 106. If so, then control passes from step 560 to step 562. At step 562, cell 106 has the minimum terminal voltage level, and minimum state machine 206 asserts bit T of MINCELL in state D1 of minimum state machine 206. Switch control circuit 208 then closes switch 357A in state D of sensor circuit 111 to update MIN with the terminal voltage level of cell 106.

During step 560, if the terminal voltage level of cell 100 is less than the terminal voltage level of cell 106, then control transfers to step 554 where operations continue in the manner set forth above.

If in step 556, W is high or X is low, then control transfers to step 564 where switch control circuit 208 determines whether W is low and X is low. If so, then during step 568 switch control circuit 208, in state C4 of switch control circuit 208, closes switches 354B and 356C. This is done by the assertion of S2+ and S3− in order to compare the terminal voltage levels of cells 102 and 104. Control then transfers from step 568 to step 570, where comparator 350 indicates the result of this comparison.

Step 570 is a comparison step, and if the terminal voltage level of cell 102 is greater than the terminal voltage level of cell 104, then control transfers to step 572. During step 572 minimum state machine 206 asserts bit R of MINCELL during state D4 of minimum state machine 206 to indicate cell 106 has the minimum terminal cell voltage. Switch control circuit 208 then closes switch 357A in state D of sensor circuit 111 to update MIN. If the terminal voltage level of cell 102 is less than the terminal voltage level of cell 104, then control transfers from step 570 to step 552 where operations continue in the manner already described.

If the switch control circuit 208 determines that W is low or X is high, control passes to step 566. At step 566, the switch control circuit 208 selects cells 102 and 104 for comparison. Control then passes from step 566 to step 574 where the comparator 350 provides the result of the comparison. If during step 574 the terminal voltage level of cell 102 is greater than the terminal voltage level of cell 104, control passes to step 562. If the terminal voltage level of cell 102 is less than the terminal voltage level of cell 106, control transfers to step 572.

Thus, although the logic behind the sequencing and comparison of the terminal cell voltages may seem complex, the maximum cell terminal voltage level MAX and the minimum cell terminal voltage MIN are updated in only five clock cycles. This is a significant improvement than that required by the use of A/D converters and microprocessors. Furthermore, a stable precision voltage reference is not required.

3. The continuous Embodiment

Shown in FIG. 10 is a schematic diagram illustrating a continuous embodiment 610 for the sensor circuit 110 of FIG. 1. An amplifier array 630 including amplifiers 418, 420, 422 and 424 provide signals representative of the terminal voltage levels of cells 100, 102, 104 and 106: A, B, C and D, respectively.

Each of battery cells 100, 102, 104 and 106 is connected through a switch circuit 401 of like construction to its respective amplifier 418, 420, 422 or 424. In each of the switch circuits 401, a capacitor 410 is connected between the non-inverting and inverting inputs of the amplifier for the particular battery cell. Each such capacitor has a charge indicative of the terminal voltage level of that cell to which it is connected. A pair of resistors 400 and 402 are provided in each switch circuit 402 to connect the capacitor 410 to the battery cell associated with that switch circuit. Amplifiers 418, 420, 422 and 424 provide output signals A, B, C and D, respectively representative of their associated cell terminal voltage level.

A logic array 640 includes a maximum logic circuit 438 and a minimum logic circuit 442. Maximum logic circuit 438 connects and disconnects a maximum voltage line MAX to amplifier output signals A, B, C or D through switches 450, 452, 454 and 456, respectively. The activation of one of these switches by maximum logic circuit 438 provides the maximum cell terminal voltage level on the MAX line. In contrast, minimum logic circuit 442 through switches 460, 462, 464 and 466 connects and disconnects a minimum cell terminal voltage line MIN to amplifier output signals A, B, C or D, respectively.

A comparator array 620 includes a number of comparators, 426, 428, 430, 432, 434, and 436 each of which receives at its inputs sample level signals from various ones of the amplifier output signals A, B, C, and D. Each of the comparators in the comparator array 620 forms an output signal which is furnished to logic array 640 to permit maximum logic circuit 438 to determine the battery cell with the maximum terminal cell voltage and also for minimum logic circuit 442 to determine the battery cell with the minimum terminal cell voltage level.

The following table represents the various comparators in comparator array 620, their respective input signals, output signals and states:

| Comparator | Input | Signals | Output | States |
|---|---|---|---|---|
| 426 | A | B | E | E = 1, A > B; E = 0, A < B |
| 428 | B | C | F | F = 1, B > C; F = 0, B < C |
| 430 | C | D | G | G = 1, C > D; G = 0, C < D |
| 432 | A | C | H | H = 1, A > C; H = 0, A < C |
| 434 | A | D | I | I = 1, A > D; I = 0, A < D |
| 436 | B | D | J | J = 1, B > D; J = 0, B < D |

From these comparisons, provided by the input signals, maximum and minimum logic circuits 438 and 442 assert the appropriate switch signals to provide the maximum terminal voltage and minimum terminal voltage levels to the MAX and MIN lines, respectively.

As shown in FIG. 11, when E is low, F is low, and G is high, cell 104 has the highest cell terminal voltage level. Thus, maximum logic circuit 438 closes switch 454 and opens switches 450, 452 and 456.

If E is low, G is low and J is low, cell 106 has the highest terminal cell voltage level. Thus, maximum logic circuit 438 closes switch 456 and opens switches 450, 452 and 454. If E is low, G is low and J is high, then cell 102 has the highest terminal cell voltage level. Thus, maximum logic circuit 438 closes switch 452 and opens switches 450, 454 and 456. If E is low, F is high and G is high, then cell 102 has the highest terminal cell voltage level. Thus, maximum logic circuit 438 closes switch 452 and opens switches 450, 454 and 456.

If E is high and G and I are low, then cell 106 has the highest terminal cell voltage level. Thus, maximum logic circuit 438 clears closes switch 456 and opens switches 450, 452 and 454. If E and I are high and G is low, then cell 100 has the highest terminal cell voltage level. Thus, maximum logic circuit 438 closes switch 450 and opens switches 452, 454 and 456.

If E and G are high and H is low, then cell 104 has the highest terminal cell voltage level. Thus, maximum logic circuit 438 closes switch 454 and opens switches 450, 452 and 456. If E, G and H are all high, then cell 100 has the highest terminal cell voltage levels. Thus, maximum logic circuit 438 closes switch 450 and opens switches 452, 454 and 456.

As shown in FIG. 12, if E, G and H are low, then cell 100 has the lowest terminal cell voltage level. Thus, minimum logic circuit 442 closes switch 460 and opens switches 462, 464 and 466. If H is high and E and G are low, then cell 104 has the lowest terminal cell voltage level. Thus, minimum logic circuit 442 closes switch 464 and opens switches 460, 462 and 466.

If E and I are low, and G is high, then cell 100 has the lowest terminal cell voltage level. Thus, minimum logic circuit 452 closes switch 460 and opens switches 462, 464 and 466. If both G and I are high, and E is low, then cell 106 has the lowest terminal cell voltage level. Thus, minimum logic circuit 442 closes switch 466 and opens switches 460, 462 and 464.

If both F and G are low, and E is high, then cell 102 has the lowest terminal cell voltage level. If E and G are high and J is low, then cell 102 has the lowest terminal cell voltage level. Thus, minimum logic circuit 442 closes switches 462, opens switches 460, 464 and 466.

If E, G and J are high, then cell 106 has the lowest terminal cell voltage level. Thus, minimum logic circuit 442 closes switch 466 and opens switches 460, 462 and 464. If both E and F are high and G is low, then cell 104 has the lowest terminal cell voltage level. Thus, minimum logic circuit 442 closes switch 464 and opens switches 460, 462 and 466.

Thus, the continuous embodiment 610 of sensor circuit 110 provides instantaneous updates of the maximum cell terminal voltage MAX and the minimum cell terminal voltage MIN. This is an improvement from prior art sensor circuits that included microprocessors and A/D converters. These prior art sensor circuits imposed relative lengthy delays to update the voltage levels as compared to the instantaneous updates provided by the continuous embodiment 610. Furthermore, a stable, precision voltage reference is not required as the cell terminal voltages are compared to each other rather than to a voltage reference.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed:

1. A sensor circuit for monitoring cells of a battery, said sensor circuit comprising:

a switched capacitor network selectively coupled to pairs of individual cells of the battery for sensing the terminal voltages of the battery cells coupled thereto and for providing terminal cell signals indicative of the terminal voltages of the battery cells;

a comparator coupled to said switched capacitor network for comparing the terminal voltages of pairs of battery cells and for providing a compare signal indicative of the comparison results;

a maximum cell indicator circuit for receiving the compare signal and providing a maximum cell signal indicative of the cell with the maximum terminal voltage present in the monitored cells; and a minimum cell indicator circuit for receiving the compare signal and providing a minimum cell signal indicative of the cell with the minimum terminal voltage present in the monitored cells.

2. The sensor circuit of claim 1, the sensor circuit further comprising:

a switch network coupled to the battery for receiving the maximum cell signal and providing a maximum cell voltage signal indicative of the maximum terminal voltage.

3. The sensor circuit of claim 2, further comprising:

an error comparator coupled to said switch network for comparing the maximum cell voltage signal with a maximum terminal cell voltage level and for providing an error signal indicative of the result of the comparison.

4. The sensor circuit of claim 1, the sensor circuit further comprising:

a switch network coupled to the battery for receiving the minimum cell signal and providing a minimum cell voltage signal indicative of the minimum terminal voltage.

5. The sensor circuit of claim 1, the sensor circuit further comprising:

a control circuit for receiving an intermediate signal indicative of another pair of terminal battery cell voltages to be compared by said comparator and for providing switching signals to said switched capacitor network in response to the intermediate signal; and an intermediate cell comparison circuit for receiving the compare signal and for generating the intermediate signal.

6. The sensor circuit of claim 1, wherein said switched capacitor network sequentially couples different pairs of individual cells of the battery.

7. The sensor circuit of claim 6, wherein said maximum cell circuit indicates the maximum voltage in sequence.

8. The sensor circuit of claim 6, wherein said minimum cell circuit indicates the minimum voltage in sequence.

9. The sensor circuit of claim 1, wherein said switched capacitor network continuously provides terminal cell signals indicative the terminal voltages of the battery cells.

10. A sensor circuit for monitoring cells of a battery, said sensor circuit comprising:

an amplifier network coupled to the battery for providing terminal cell voltage signals indicative of the terminal cell voltages of the battery cells, said amplifier network having two or more amplifiers;

a comparator network having one or more comparators for comparing the terminal cell voltage signals received from said amplifier network and for providing comparison signals indicative of the comparison results;

a maximum indicator cell circuit for receiving the comparison signals and providing a maximum cell signal indicative of the cell with the maximum terminal voltage present in the monitored cells; and a minimum cell indicator circuit for receiving the comparison signals and providing a minimum cell signal indicative of the cell with the minimum terminal voltage present in the monitored cells.

11. The sensor circuit of claim 10, the sensor circuit further comprising:

a switch network coupled to the battery for receiving the maximum cell signal and providing a maximum cell voltage signal indicative of the maximum terminal voltage.

12. The sensor circuit of claim 11, further comprising:

an error comparator coupled to the switch network for comparing the maximum cell voltage signal with a maximum terminal cell voltage level and for providing an error signal indicative of the result of the comparison.

13. The sensor circuit of claim 10, the sensor circuit further comprising:

a switch network coupled to the battery for receiving the minimum cell signal and providing a minimum cell voltage signal indicative of the minimum terminal voltage.

* * * * *

UNITED STATES PATENT AND TRADEMARK OFFICE
CERTIFICATE OF CORRECTION

PATENT NO. : 5,677,077 Page 1 of 1
DATED : October 14, 1997
INVENTOR(S) : A. Faulk It is certified that error appears in the above-identified patent and that said Letters Patent is hereby corrected as shown below:

Column 14,
Line 19, after "indicative" insert -- of --.

Signed and Sealed this

Thirteenth Day of December, 2005

JON W. DUDAS
*Director of the United States Patent and Trademark Office*